(12) United States Patent
Behrends et al.

(10) Patent No.: US 9,058,861 B2
(45) Date of Patent: Jun. 16, 2015

(54) POWER MANAGEMENT SRAM WRITE BIT LINE DRIVE CIRCUIT

(71) Applicant: International Business Machines Corporation, Armonk, NY (US)

(72) Inventors: Derick G. Behrends, Rochester, MN (US); Todd A. Christensen, Rochester, MN (US); Travis R. Hebig, Rochester, MN (US); Michael Launsbach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 13/718,657

(22) Filed: Dec. 18, 2012

(65) Prior Publication Data

US 2014/0169076 A1    Jun. 19, 2014

(51) Int. Cl.
 G11C 7/00     (2006.01)
 G11C 7/12     (2006.01)
 G11C 11/419   (2006.01)

(52) U.S. Cl.
 CPC .............. *G11C 7/12* (2013.01); *G11C 11/419* (2013.01)

(58) Field of Classification Search
 CPC ..... G11C 7/12; G11C 11/5628; G11C 7/1096
 USPC ................. 365/154, 189.16, 189.11
 See application file for complete search history.

(56) References Cited

U.S. PATENT DOCUMENTS

| | | | |
|---|---|---|---|
| 5,384,730 A * | 1/1995 | Vinal | 365/156 |
| 5,818,757 A * | 10/1998 | So et al. | 365/185.18 |
| 6,181,599 B1 * | 1/2001 | Gongwer | 365/185.18 |
| 6,373,753 B1 * | 4/2002 | Proebsting | 365/189.09 |
| 6,498,516 B2 | 12/2002 | Yau | |
| 6,549,450 B1 | 4/2003 | Hsu et al. | |
| 6,628,540 B2 | 9/2003 | Marshall et al. | |
| 6,738,306 B2 | 5/2004 | McLaury | |
| 8,077,493 B2 | 12/2011 | Katayama | |
| 8,233,342 B2 * | 7/2012 | Adams et al. | 365/203 |
| 2005/0047233 A1 | 3/2005 | Deng | |
| 2012/0008449 A1 | 1/2012 | Chuang et al. | |
| 2012/0140551 A1 * | 6/2012 | Arsovski et al. | 365/154 |
| 2012/0224448 A1 | 9/2012 | Masleid | |
| 2012/0236675 A1 | 9/2012 | Chan et al. | |

OTHER PUBLICATIONS

Tu et al., "Single-Ended Subthreshold SRAM with Asymmetrical Write/Read-Assist", IEEE Transactions on Circuits and Systems—I: Regular Papers, vol. 57, No. 12, Dec. 2010, pp. 3039-3047, © 2010 IEEE. DOI: 10.1109/TCSI.2010.2071690.

* cited by examiner

*Primary Examiner* — Tuan T Nguyen
(74) *Attorney, Agent, or Firm* — Robert R. Williams

(57) ABSTRACT

A static random access memory (SRAM) having two or more SRAM memory cells connected with a write bit line (WBL) and a write bit line complement (WBLC) is disclosed. The SRAM may include a write driver logic coupled to the WBL and the WBLC. The write driver logic is adapted to drive a selected bit line of the WBL and the WBLC to a voltage uplevel below a first supply voltage and shut off the drive to the selected bit line when the selected bit line reaches the uplevel. The write driver logic is further adapted to drive an unselected bit line of the WBL and the WBLC to a downlevel, in conjunction with the driving of the selected bit line to the uplevel, where the downlevel is a second supply voltage lower than the first supply voltage.

20 Claims, 6 Drawing Sheets

FIG. 1 – Prior Art

POWER MANAGEMENT SRAM WRITE BIT LINE DRIVE CIRCUIT

TECHNICAL FIELD

The present disclosure relates to a static random-access memory (SRAM). In particular, this disclosure relates to reduced voltage write bit line for an SRAM.

BACKGROUND

SRAMs may be structured so that two or more SRAM cells are connected in parallel to one or more write bit lines. The write bit line(s) are coupled to a data input through a write driver logic. Prior to a write operation, the write driver logic may drive one of the write bit lines high, in conjunction with driving another of the write bit lines low, in response to a logic value applied to the data input. A particular SRAM cell is selected for writing by activating the cell's write word line. Once an SRAM cell's write word line is activated, the data value represented by the logic state(s) of the write bit line(s) may be written into the SRAM cell. The write word line is deactivated following the write operation. The state of the write bit line(s) may be changed prior to the next write operation.

FIG. 1 is a schematic representation of a portion of a prior art SRAM circuit 100 having a column of SRAM cells 110, a write driver logic 156, a data input (DATA) 150, a write bit line (WBL) 160, and a write bit line complement (WBLC) 158. Each cell 110 includes a pair of cross-coupled inverters, 130, 132, a write word line (WWL) 108, a read word line (RWL) 106, and a read data line (RD) 103. Each cell 110 also includes NFET pass transistors 1N1 and 1N2, read transistors 1N3 and 1N8, and the nodes data true (TRU) 104 and data complement (CMP) 102.

SRAM cells 110 are coupled to the write driver logic 156 through the WBL 160, and the WBLC 158. The transistors depicted in FIGS. 1, 2 and 4 will be recognized by one with ordinary skill in the art to be arranged to implement functions including pass gates, pull-up and pull-down devices.

The write driver logic 156 is comprised of inverter 162 coupled to DATA 150 and WBLC 158, and inverter 164 coupled to WBLC 158 and WBL 160. Inverters 162 and 164 are connected so as to invert and buffer (respectively) the logic value of DATA 150, while driving WBLC 158 and WBL 160, respectively with complimentary logic values. While the write bit line in this prior art example comprises two complimentary write bit lines WBL 160 and WBLC 158, other types of SRAMs are contemplated which may employ only a single write bit line.

WBL 160 and WBLC 158 are connected to all SRAM cells 110 in a particular SRAM cell column, and distribute the logic value present on DATA 150 to all SRAM cells 110 within that column. Transistors 1N1 and 1N2 and WWL 108 are used to control the write operation to SRAM cell 110. Each SRAM cell 110 of an SRAM column has its own WWL 108, RWL 106, and RD 103, but only one of each is shown for simplicity of the text and figures.

One of ordinary skill in the art will recognize that "0" and "1" refer to logical "zero" and "one" values, respectively.

A write operation employs the write driver logic 156. As an illustration, to write a 1 to the cell 110, a 1 data value is applied to the DATA 150 input. The write driver logic 156 inverts and buffers the 1 value using inverters 162 and 164, driving a 1 on WBL 160 and a 0 on WBLC 158. WWL 108 is subsequently used to turn on pass transistors 1N1 and 1N2, applying the 1 present on the WBL 160 and the 0 present on the WBLC 158 to the cross-coupled inverters 130 and 132 within SRAM cell 110. The 1 data value applied to DATA 150 is then written into the SRAM cell 110. After the data write operation, the WWL 108 is disabled, shutting off pass transistors 1N1 and 1N2. The logic value on the DATA 150 may then change in preparation for a further write operation A read operation employs the transistors 1N3 and 1N8 and the RWL 106 to enable reading, and RD 103 as an output capable of indicating the data read from SRAM cell 110. Each SRAM cell 110 includes transistors 1N3 and 1N8, an RWL 106 and an RD 103, although these are only shown in one cell 110 (FIG. 1) for simplicity of figures and descriptions.

SUMMARY

One embodiment is directed to a static random access memory (SRAM). The SRAM may include two or more SRAM memory cells connected with a write bit line (WBL) and a write bit line complement (WBLC). In addition, the SRAM may also include a write driver logic coupled to the WBL and the WBLC. The write driver logic is adapted to drive a selected bit line of the WBL and the WBLC to a voltage uplevel below a first supply voltage and shut off the drive to the selected bit line when the selected bit line reaches the uplevel. The write driver logic is also adapted to drive an unselected bit line of the WBL and the WBLC to a downlevel, in conjunction with the driving of the selected bit line to the uplevel. The downlevel is a voltage lower than the uplevel voltage, and low enough to be interpreted as a downlevel by the SRAM cell.

Another embodiment is directed to a static random access memory (SRAM). The SRAM may include two or more SRAM memory cells connected with a write bit line (WBL) and a write driver logic coupled to the WBL. The write driver logic is adapted to drive the WBL to a voltage uplevel below a first supply voltage in response to a first logical value on a data input, and to shut off the drive to the WBL when the WBL reaches the uplevel. The write driver logic is further adapted to drive the WBL to a downlevel, in response to a second logical value on the data input. The downlevel is a voltage lower than the uplevel voltage, and low enough to be interpreted as a downlevel by the SRAM cell.

A further embodiment is directed to a design structure for producing an SRAM. Aspects of the various embodiments may allow power consumption in an SRAM to be reduced.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

In the drawings and the Detailed Description, like numbers generally refer to like components, parts, steps, and processes.

DETAILED DESCRIPTION

Figure 1:
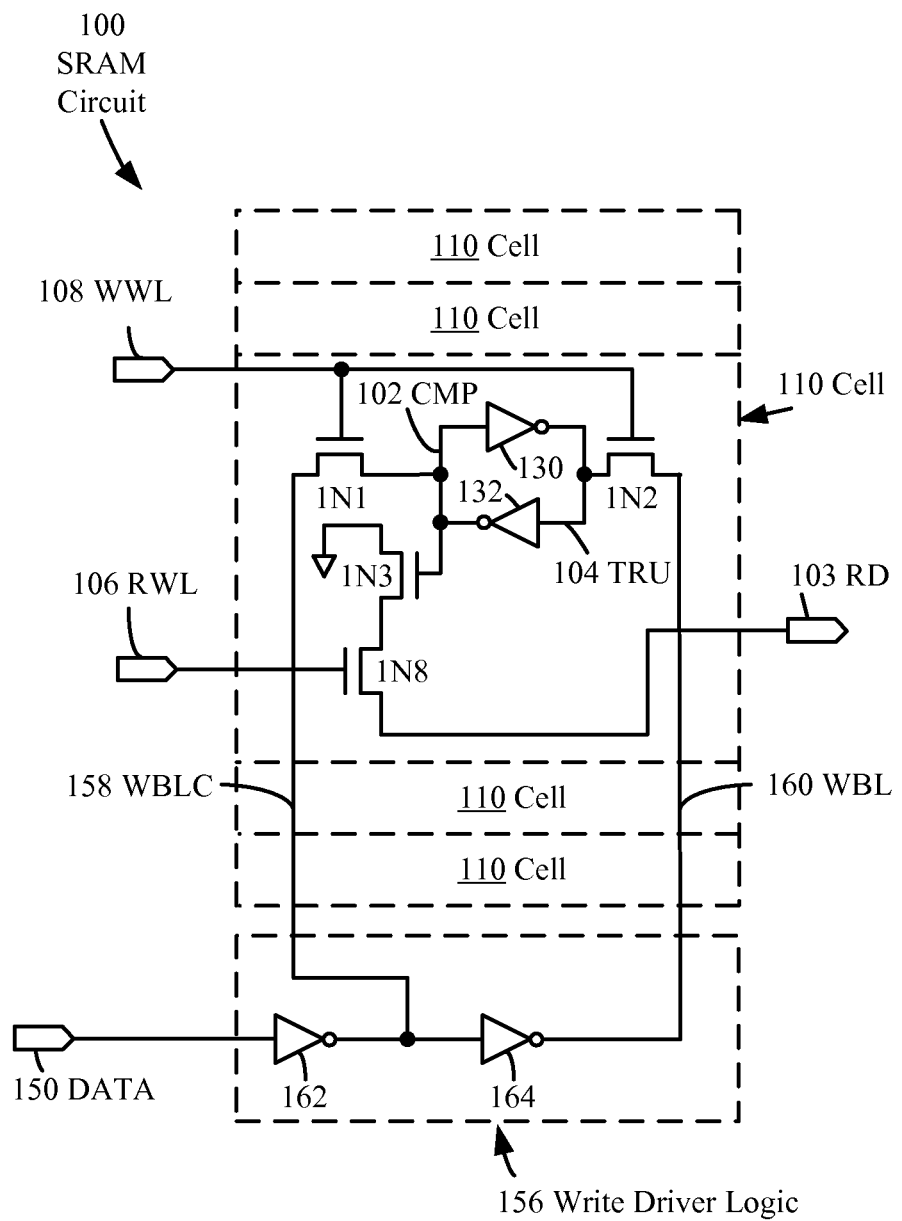
FIG. 1 is a schematic representation of a portion of a prior art SRAM circuit having write driver logic.

According to embodiments of the invention, an SRAM write bit line (WBL) may be driven by a write driver logic to a voltage uplevel below a first supply voltage. An SRAM column may contain a write driver logic and one or more SRAM cells, each cell storing a 1 or a 0. The SRAM cells may be coupled to the write driver logic through the WBL. During an SRAM write operation, the write driver logic may receive a data value from a data input. The write driver logic may drive the data value on a write bit line (WBL). The WBL may be connected to an SRAM cell. Connections between the WBL and the SRAM cell may be enabled by a write word line (WWL) causing the data value present on the WBL to be written into the SRAM cell. The WWL may be subsequently disabled, and the WBL may be driven to another data value for a next write operation.

The term "write bit line" is a generic term that may be used to indicate a single signal connected to two or more SRAM cells that conveys a logic value (0 or 1) to be written into an SRAM cell. "Write bit line" may also be used to indicate a pair of signals comprising, for example, a true (WBL) and a complement (WBLC) used in a similar manner. The terms "true" and "complement" are used only to distinguish two similar but inversely operable lines.

It will be appreciated by one skilled in the art of SRAM design that when the term "write bit line" indicates a pair of signals, that the signal pair will always be logical compliments of each other (one signal is a 1 while the other is a 0) during a write, within the timing tolerances of the logic used to generate them. It will also be understood that the logic used to drive each of the WBL and WBLC signals may be identical in structure and function, and may differ only in which phase of the data input signal is applied to the logic input.

For simplicity of the text, only the process of writing a 1 into an SRAM cell will be described, however, writing a 0 into an SRAM cell is a similar operation, using complimentary polarities of signals, and logic functions, understood by those skilled in the art. The write data true (WDT) and write data complement (WDC) logic functions (FIG. 4 354, 352) for example are identical in both structure and function, the only difference between them being the polarity of the logic signal presented to their inputs.

Exemplary embodiments shown in FIGS. 1, 2, 3 and 4 depict the write bit line as a complimentary signal pair WBL and WBLC. This depiction does not limit the invention in any way. A single signal embodiment of the write bit line, or other means of conveying data to be written to an SRAM cell is contemplated.

Power reduction and management are becoming increasingly important as circuit technology advances. The write bit lines of SRAMs are often long, heavily loaded nets, having a rail to rail voltage swing between GND and Vdd. Fully drawing write bit lines to Vdd in SRAM circuits consumes unneeded energy and resources, while providing no performance benefit to SRAMs.

A reduction in write bit line voltage swing and SRAM switching power may result from drawing the write bit line to an uplevel below Vdd. Decreasing SRAM circuit power consumption may enable chips with lower overall power consumption.

A write driver logic with a feedback path to turn it off at a voltage below a first supply voltage but high enough to write data into an SRAM cell may be used in conjunction with a keeper circuit employing an NFET between the supply voltage Vdd and the write bit line. A reduction in write bit line voltage swing may result, causing a reduction of required write operation power. Reduction of write operation power may provide opportunities for SRAM and overall chip power management.

As may be seen from the following equation, the reduction of overall WBL voltage swing may reduce the energy consumed to charge and discharge the write bit lines:

$$P = A \times C \times V^2 \times F$$

Where:
P=chip dynamic power consumption (W)
A=activity factor (coefficient with values between 0 and 1 indicating signal activity level)
C=capacitance of nodes being charged and discharged (F)
V=signal voltage swing (V)
F=switching frequency (Hz)

Reducing the voltage difference between the WBL uplevel voltage and the WBL downlevel voltage reduces V in the equation, which may in turn exponentially reduce power used in a write operation.

The device electrical characteristics of the NFETs employed in keeper circuits allow the write bit lines to be held at a voltage level of one NFET threshold voltage (Vt) below Vdd, according to embodiments of the invention. The write driver logic may also provide rapid charging of the write bit line (WBL), which may cause an SRAM performance increase.

When the source of an NFET pass transistor connected to the write bit line rises above (Vdd-Vt), where Vt is the NFET threshold voltage, the NFET is cut off, not allowing any more current to flow through it. Now referring to FIG. 1, when a write bit line (WBL) 160 is driven to apply a voltage uplevel to an inverter pair 130, 132 in an SRAM cell 110, if the voltage on WBL 160 is higher than the voltage on TRU 104, then the source of NFET 1N2 is the side connected to TRU 104. Once TRU 104 rises above the voltage of (Vdd-Vt), current no longer flows through NFET 1N2 to charge up TRU 104. Thus, any power consumed in drawing WBL 160 (or similarly, WBLC 158) to a voltage above (Vdd-Vt) is wasted, as charging of TRU 104 ceases at that voltage level.

Figure 2:
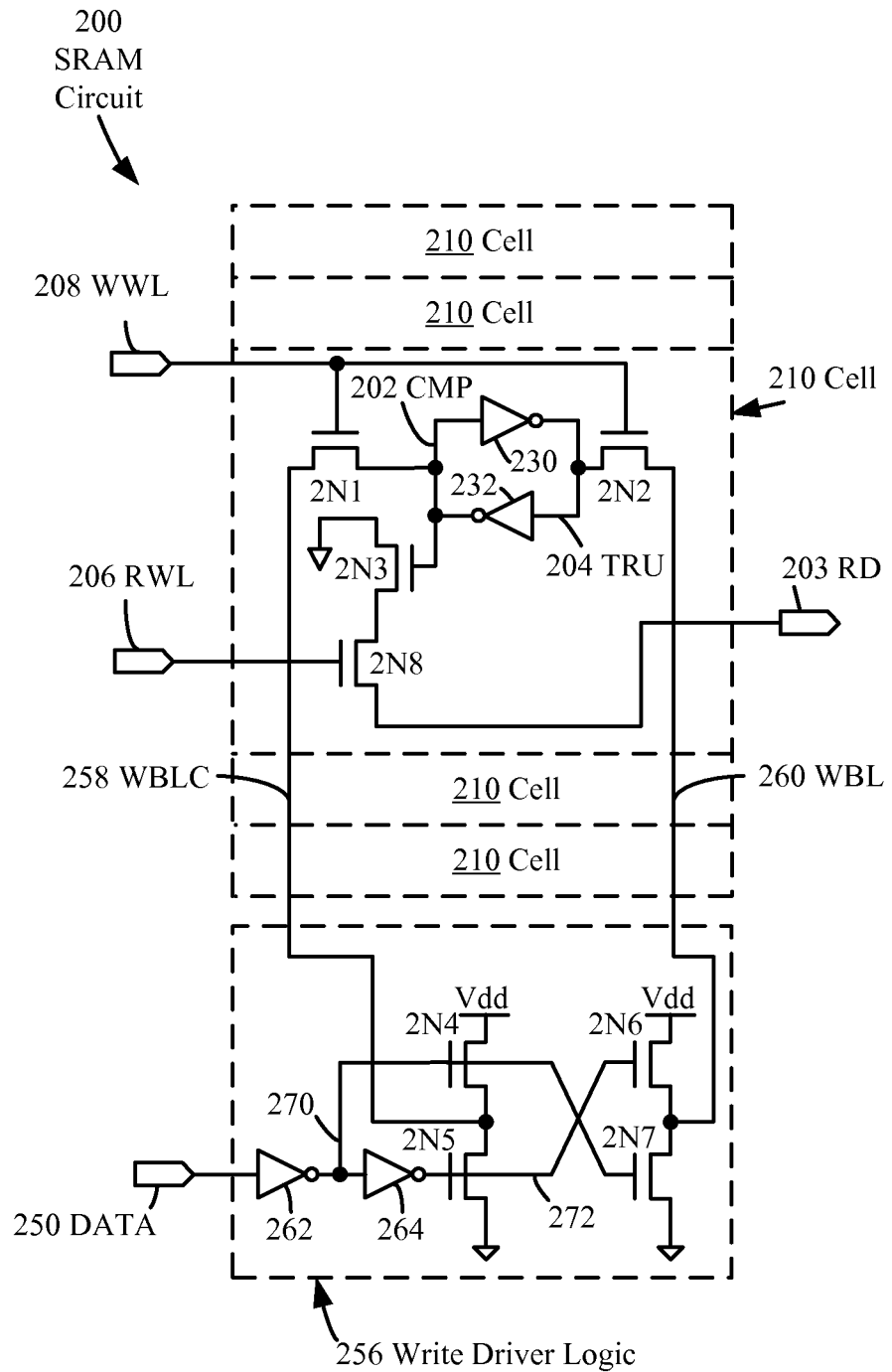
FIG. 2 is a schematic representation of a portion of an SRAM circuit having write driver logic with an NFET pullup device.

FIG. 2 is a schematic representation of a portion of an SRAM circuit 200 having a column of SRAM cells 210, a write driver logic 256, a data input (DATA) 250, a write bit line (WBL) 260, and a write bit line complement (WBLC) 258. Referring to FIG. 1, the SRAM cells 210, WBL 260, and WBLC 258 are identical to the SRAM cells 110, WBL 160, and WBLC 158 (respectively) previously described.

Again referring to FIG. 1, one difference between write driver logic 156 and write driver logic 256 (FIG. 2) is use of NFET transistors 2N6 and 2N4 coupled between Vdd and WBL 260, WBLC 258, respectively, to draw the WBL 260 and WBLC 258 to an uplevel below Vdd. As an example, if a 1 is applied to the data input (DATA) 250, inverters 262 and 264 buffer the signal, driving a 1 on the gate of NFET 2N6, turning it on. NFET 2N6 then couples WBL 260 to VDD, subsequently charging WBL 260, drawing its voltage towards Vdd. As the WBL 260 voltage approaches Vdd-Vt, the charging of WBL 260 diminishes rapidly, and the voltage "rolls off", as shown in WBL voltage 514 (FIG. 5) of SRAM circuit 200. Similarly, the TRU voltage 512 (FIG. 5) of SRAM circuit 200 also rolls off.

The SRAM circuit 200 (FIG. 2) may result in reduced power consumption (as previously described), relative to the prior art SRAM circuit 100 (FIG. 1) due to the reduced voltage swing of write bit lines. However, it may also yield reduced performance, due to the lower slew rate of the write bit lines (FIG. 5), which may not be desirable. Reduced SRAM power consumption accompanied by a performance reduction may not be a desirable combination.

Figure 3:
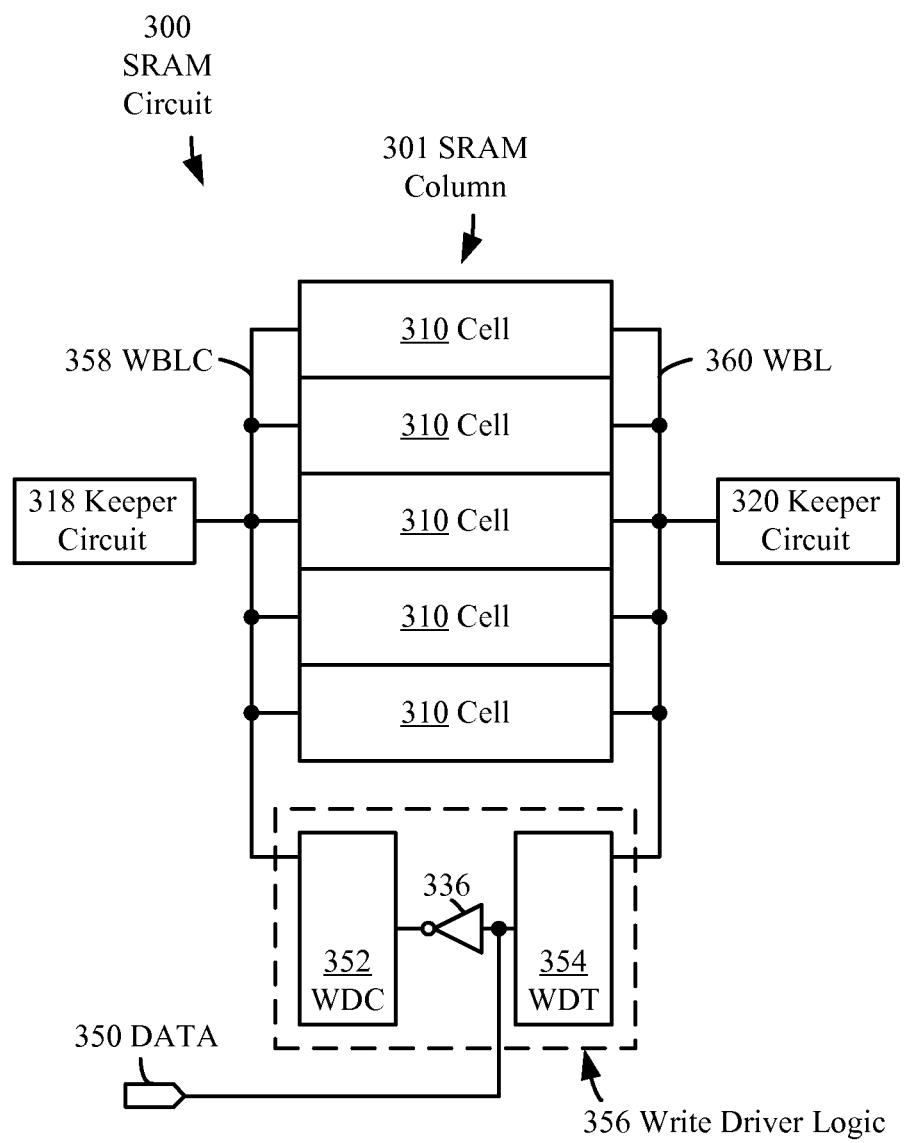
FIG. 3 is a diagrammatic representation of a portion of an SRAM including a column of SRAM cells, write driver logic, and keeper circuits according to embodiments of the invention.

FIG. 3 is a diagrammatic representation of a portion of an SRAM circuit 300 having a write driver logic 356 and keeper circuits 318 and 320 coupled to an SRAM column 301, according to embodiments of the invention.

The SRAM circuit 300 may contain an SRAM column 301 coupled to the write driver logic 356 and keeper circuits 318 and 320. The column may have a plurality of SRAM cells 310, each coupled to the write driver logic 356 and keeper circuits 318 and 320 through a write bit line (WBL) 360 and a write bit line complement (WBLC) 358.

The write driver logic 356 may be comprised of a write data true (WDT) 354 logic, a write data complement (WDC) 352 logic and an inverter 336. A data input (DATA) 350 may be coupled to the input of the inverter 336 and the input of the write data true (WDT) 354 logic. The output of the inverter 336 may be coupled to the input of the write data complement (WDC) 352 logic. The output of WDT 354 may drive the WBL 360 and the output of the WDC 352 may drive the WBLC 358. The WDT 354 and the WDC 352 logics may be identical in structure and function.

In embodiments of the invention, driving the WBL 360 to an uplevel may be carried out through the write driver logic 356, which may use a switch, such as a P-channel field effect transistor (PFET) operated by a data input (DATA) 350 signal. Embodiments of the invention may also hold or "keep" the WBL voltage level once it has been driven to an uplevel. Holding the WBL voltage level may be accomplished by using an NFET keeper circuit which is activated through feedback circuitry. So long as there is no drive path enabled for the WBL 360, the WBL 360 may not be driven to an uplevel. Once a signal on the DATA input 350 enables a drive path for the WBL 360, the WBL 360 may be driven to an uplevel by the write driver logic 356. The write driver logic 356 may have a gate operated by a DATA 350 signal.

In embodiments of the invention the WBL 360 voltage may be at a downlevel from a previous write operation. Prior to a write operation, a data value (0 or 1) is presented to DATA 350. The write driver logic 356 may either drive WBL 360 to an uplevel or a downlevel, in response to the data value on DATA 350. For example, if the signal on DATA 350 is a 1, then write driver logic 356 may drive WBL 360 to an uplevel less than Vdd, and if the signal on DATA 350 is a 0, then write driver logic 356 may drive WBL 360 to a downlevel below the uplevel. Once the data presented on DATA 350 is represented on WBL 360, it is then written into one of the SRAM cells 310.

Figure 5:
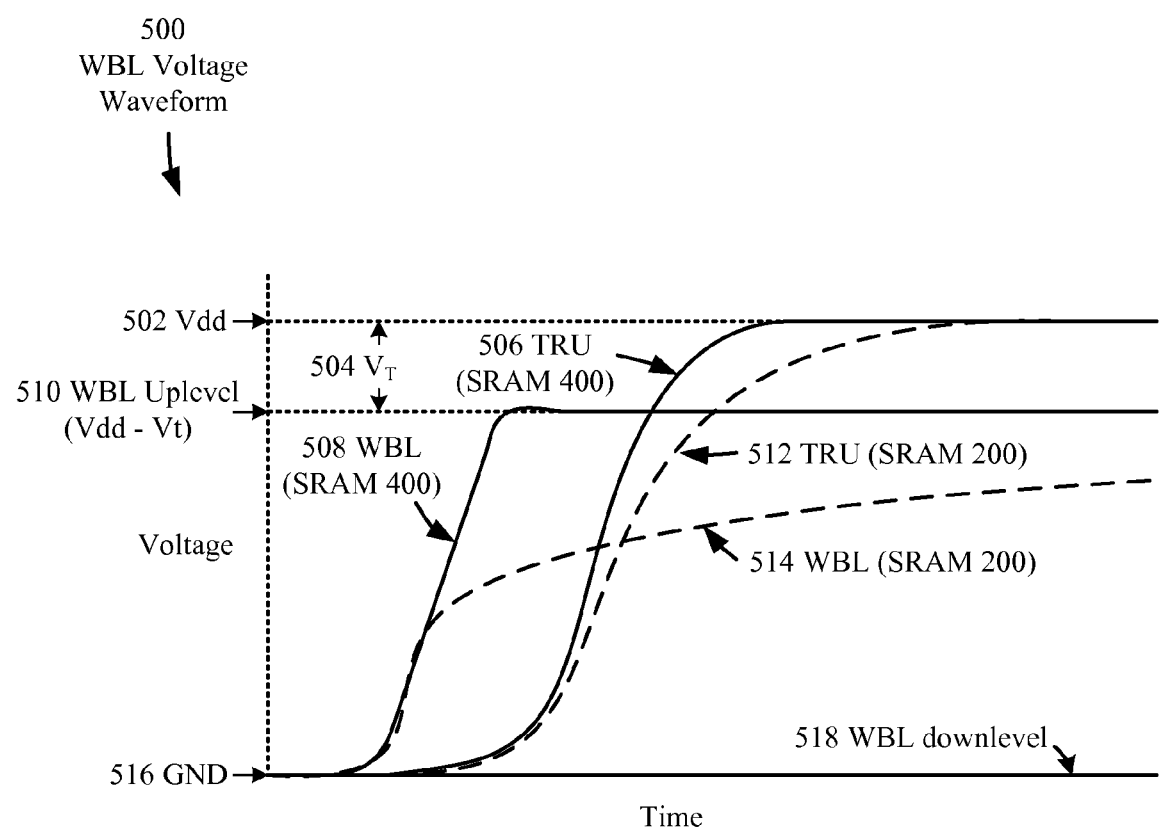
FIG. 5 is a waveform diagram of the SRAM circuit of FIG. 2, 4, according to embodiments of the invention.

Various embodiments may contain sections of circuitry within the write driver logic 356 that may drive individual write bit lines to an uplevel or a downlevel, such as write data true (WDT) 354 and write data complement (WDC) 352. Embodiments may also include keeper circuits (318 and 320) that may hold write bit lines at a WBL uplevel 510 (FIG. 5). Both write data and keeper circuits may provide coupling between Vdd and write bit lines.

One of the purposes of the write data logic is to rapidly pull up the write bit lines (358, 360) to a 1 state (uplevel) to prepare it for a write operation. A write data circuit connects the WBL 360 to Vdd in response to a 1 level on the DATA 350 input. After the WBL 360 has been pulled to an uplevel, the WDT 354 is disabled, shutting off the driving connection between Vdd and WBL 360.

The SRAM circuit 300 (FIG. 3) may result in reduced power consumption (as previously described) with no performance loss relative to the prior art SRAM circuit 100 (FIG. 1). SRAM circuit 300 may also result in increased performance over the SRAM circuit 200 (FIG. 2), which may be desirable. The voltage waveform WBL voltage 508 is an exemplary illustration of a charging curve of the WBL 360 as it is driven to an uplevel by WDT 354.

The purpose of the keeper circuit such as 318 or 320 is to counteract any charge leakage that would cause the WBL 360 or WBLC 358 voltage to decrease from its uplevel over time. If the voltage of the WBL 360 is allowed to decrease due to leakage, it may incorrectly represent a 0 value, causing a data write error in the SRAM. The keeper circuit couples the WBL 360 to Vdd when the WBL 360 voltage is sensed at a 1 voltage level. The keeper circuit maintains a relatively weak connection between the WBL 360 and Vdd, which may generally be overcome without difficulty by the write driver logic 356 when the write driver logic 356 is driving a 0 on the WBL 360. When the WBL 360 is discharged or pulled to a 0 level, the keeper circuit disables its connection between Vdd and WBL 360.

The NFET transistor used in the keeper circuits 318, 320 provides a voltage drop between Vdd and the WBL 360. The connection scheme and electrical properties of the NFET transistors ensure a voltage drop between NFET source and drain terminals, causing the WBL uplevel voltage 510 (in FIG. 5) to be one NFET threshold voltage (Vt) 504 (FIG. 5) below Vdd 502 (FIG. 5).

Other embodiments of the elements of FIG. 3 are contemplated.

Figure 4:
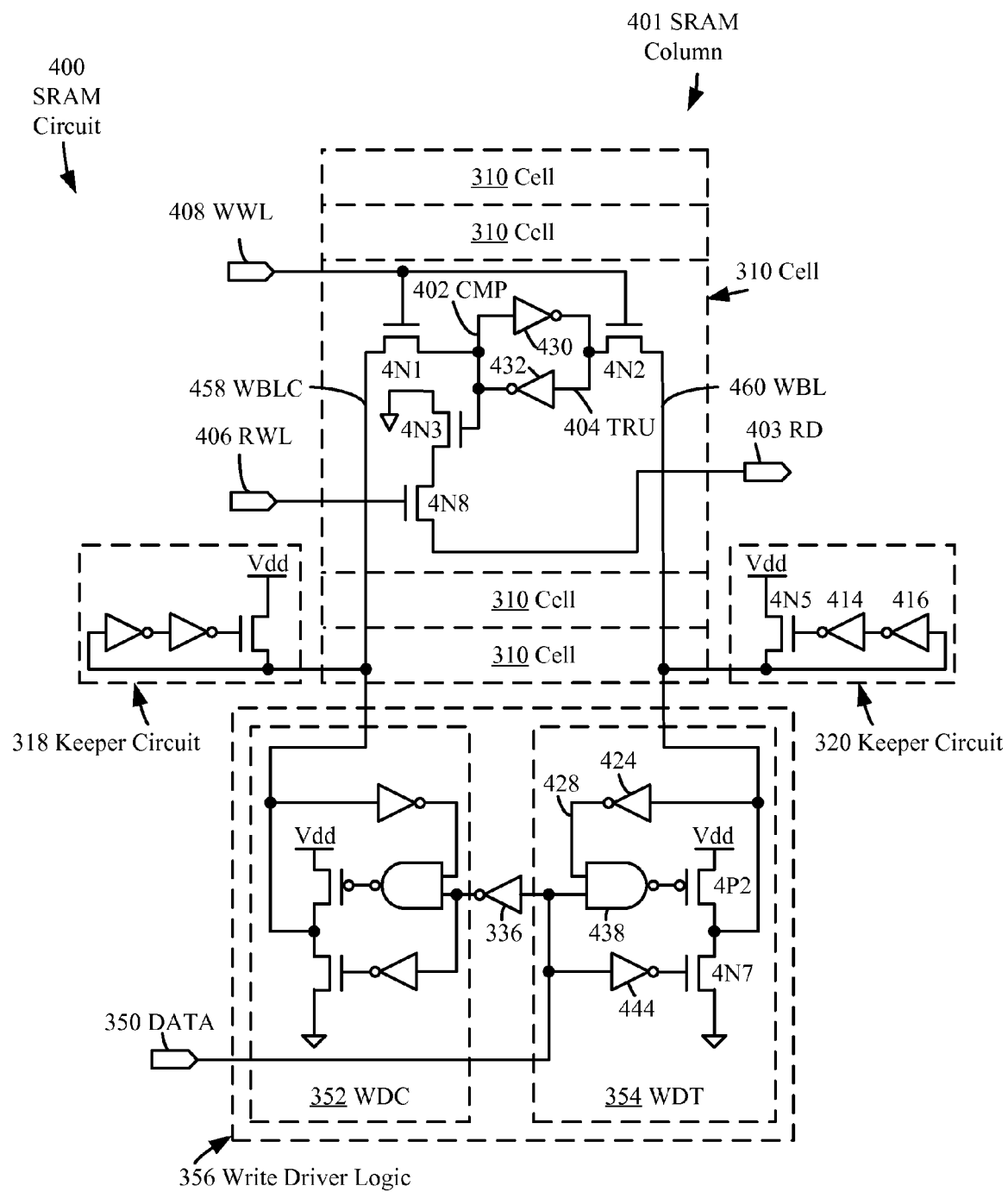
FIG. 4 is a schematic representation of the SRAM circuit of FIG. 3, according to one embodiment of the invention.

FIG. 4 is a schematic representation of a portion of an SRAM circuit 300 having a column 401 coupled to a write driver logic 356 and keeper circuits 318 and 320, according to embodiments of the invention.

The column 401 may have a plurality of SRAM cells 310, each coupled to the write driver logic 356 and keeper circuits 318 and 320 through a write bit line (WBL) 460 and a write bit line complement (WBLC) 458. The write driver logic 356 is comprised of a write data true (WDT) 354 logic, a write data complement (WDC) 352 logic and an inverter 336.

The SRAM cells 310, including all devices, inputs and outputs are identical to SRAM cells 110 previously described in reference to FIG. 1.

The interconnection of WDT 354 logic, WDC 352 logic and inverter 336 is identical to the interconnection previously described for WDT 354, WDC 352 and inverter 336 (FIG. 3). For simplicity of the text, only the WDT 354 will be described, as the WDC 352 is identical to it in both structure and functionality.

One purpose of the write data true (WDT) circuit 354 is to provide a means to drive the WBL 460 to a WBL uplevel 510 (FIG. 5) (logic 1 value) corresponding to a voltage below a supply voltage Vdd (502) (FIG. 5), but suitable to drive the "1" into the SRAM cell 310. Another purpose of the write data true (WDT) circuit 354 is to provide a means to drive the WBL 460 to a downlevel (logic 0 value) corresponding to a WBL downlevel 518 (FIG. 5).

The write data true (WDT) circuit 354 includes NFET 4N7 with a source connected to GND, a drain connected to WBL 460, and a gate connected to the output of inverter 444. The input of inverter 444 is connected to the data input (DATA)

350. Inverter 444 and NFET 4N7 are used together to control driving the WBL 460 to a downlevel.

The write data true (WDT) circuit 354 also includes PFET 4P2 with a source connected to Vdd, a drain connected to WBL 460, and a gate connected to the output of NAND gate 438. One input of NAND gate 438 is connected to the data input (DATA) 350, and the other input is connected to the output of inverter 424. The input of inverter 424 is connected to WBL 460. Inverter 424, NAND gate 438 and PFET 4P2 are used to control driving the WBL 460 to an uplevel.

As an illustration of an operation of driving WBL 460 to an uplevel, it is assumed that the data value on input DATA 350 is initially a 0 and that the WBL 460 is a 0, ready to be driven to an uplevel. The initial states of both DATA 350 and WBL 460 cause the PFET 4P2 gate, the NFET 4N7 gate and node 428 to all be 1.

The operation to drive WBL to an uplevel begins with the DATA 350 signal changing from a 0 to a 1, causing inverter 444 to drive a 0 on the gate of NFET 4N7. The 0 on the gate of NFET 4N7 causes it to shut off, terminating the connection between WBL 460 and GND. The NAND gate 438 responds to the 1 inputs from DATA 350 and node 428, and drives a 0 on the gate of PFET 4P2, turning it on. When on, PFET 4P2 connects Vdd to WBL 460, rapidly increasing the WBL voltage 508 (in FIG. 5) from the WBL downlevel 518 (in FIG. 5).

As the voltage level of the WBL 460 rises from the WBL downlevel 518 (in FIG. 5), and crosses the switching threshold of inverter 424, inverter 424 drives a 0 on node 428. The 0 on node 428 causes the NAND gate 438 to drive a 1 on the gate of PFET 4P2, shutting it off. Once PFET 4P2 is shut off, the connection of Vdd to WBL 460 connection is terminated, causing the driving of WBL 460 to cease.

The described feedback path creates a self-timed circuit that only enables the WBL 460 to be driven high as long as necessary to raise the WBL voltage 508 (FIG. 5) to a WBL uplevel (Vdd-Vt) 510 (FIG. 5). A designer may specify and tune the inverter 424 switching threshold to turn off PFET 4P2 just as WBL 460 reaches the WBL uplevel (Vdd-Vt) 510 (FIG. 5). Inverter 424 switching threshold adjustments may be made to accommodate various loads and slew rates of WBL 460, as well as the combined delay of inverter 424 and NAND gate 438. For example, a width/length ratio of a PFET pullup in inverter 424 that is large relative to a width/length ratio of an NFET in inverter 424 would make an inverter switching threshold higher than Vdd/2.

WBL voltage 508 (in FIG. 5) depicts an exemplary WBL charging waveform with a rapid slew rate, and limited voltage swing, both of which may be desirable.

As an illustration of an operation of driving WBL 460 to a downlevel, it is assumed that the data value on input DATA 350 is initially a 1, and that the WBL 460 is a 1, ready to be driven to an downlevel. The initial states of both DATA 350 and WBL 460 cause the PFET 4P2 gate to be a 1, and the NFET 4N7 gate and node 428 to be 0.

The operation to drive WBL to a downlevel begins with the DATA 350 signal changing from a 1 to a 0, causing inverter 444 to drive a 1 on the gate of NFET 4N7. The 1 on the gate of NFET 4N7 causes it to turn on, creating a connection between WBL 460 and GND. When on, NFET 4N7 rapidly decreases the WBL 460 voltage until WBL 460 reaches WBL downlevel 518. The NAND gate 438 continues to drive a 1 on the gate of PFET 4P2, keeping it turned off.

The purpose of the keeper circuits 318 and 320 is to counteract any charge leakage that would cause the WBL 460 or WBLC 458 voltage to decrease from its uplevel over time. For simplicity of the text, only the keeper circuit 320 will be described, as the keeper circuit 318 is identical to it in both structure and functionality.

The keeper circuit connects the WBL 460 to Vdd when the WBL voltage is sensed at a 1 voltage level. Inverters 416 and 414 provide a copy of the 1 level sensed on WBL 460 to the gate of NFET 4N5, turning it on. The keeper circuit maintains a relatively weak connection between the WBL 460 and Vdd, which may generally be overcome without difficulty by the write data true (WDT) logic 354. When the WBL 460 is driven to a downlevel, the keeper circuit disables its connection between Vdd and WBL 460. The NFET transistors used in the keeper circuit paths provide a voltage drop between Vdd and the WBL 460. The connection scheme and electrical properties of the NFET transistors ensure a voltage drop between NFET source and drain terminals, causing the WBL uplevel 510 (FIG. 5) to be one NFET threshold voltage (Vt) 504 (FIG. 5) below Vdd 502 (FIG. 5).

A designer may specify the switching threshold of inverter 416 to be less than the inverter 424 switching threshold, approximating one half of Vdd. Providing the inverter 416 with a lower switching threshold than the inverter 424 ensures that the keeper circuit may become and stay activated despite minor variations in the WBL uplevel voltage 510 (FIG. 5). The switching threshold of inverter 416 may also be tuned to provide suitable noise margins between the WBL uplevel voltage 510 (in FIG. 5) and WBL downlevel voltage 518 (FIG. 5).

A designer may also specify the NFET 4N5 width and length to enable the write data true (WDT) 354 logic to overcome NFET 4N5 without difficulty.

One of ordinary skill in the art will appreciate that the embodiments depicted in FIGS. 3 and 4 may produce shorter WBL rise times, and less roll off than the embodiment depicted in FIGS. 2 and 5, which may be desirable. The performance difference may arise from an NFET in the WBL drive path of write driver logic 256 (FIG. 2) having a gate to source voltage approaching an NFET threshold voltage during the latter part of the WBL 260 drive operation, limiting the current the NFET may source to the WBL to charge it.

FIG. 5 is a waveform diagram depicting exemplary WBL 460 and TRU 404 (in FIG. 4) voltage levels during a write operation of an SRAM cell according to embodiments of the invention. FIG. 5 also depicts an exemplary WBL voltage 508 swing between the WBL downlevel 518 and the WBL uplevel 510. FIG. 5 also illustrates an exemplary TRU voltage 506 swing between the GND 516 and the Vdd 502.

Waveform TRU 512 illustrates a charging curve of node TRU 204 (FIG. 2), and WBL 514 illustrates a charging curve of node WBL 260 of (FIG. 2).

In this example, WBL downlevel voltage 518 may be identical to the ground (GND) 516. Other embodiments may employ WBL downlevel voltages 518 that differ from ground (GND) 516.

Prior to a write operation, the WBL 360 (in FIG. 3) may be drawn to the WBL uplevel 510. The WBL uplevel voltage (Vdd-Vt) 510 may be one NFET threshold (Vt) 504 below Vdd 502.

In an exemplary embodiment of the invention, the NFET threshold (Vt) 504 may be approximately ten percent of the supply voltage Vdd 502. In another exemplary embodiment of the invention, the Vt 504 may be approximately twenty percent of the supply voltage Vdd 502. A generally accepted range of Vt 504 values lies between approximately ten and thirty percent of supply voltage Vdd 502, but this range does not limit possible (Vt) 504 values in any way. NFET threshold voltages may vary according to several factors, including but not limited to various design parameters and semiconductor process variations. One skilled in the art of SRAM design may understand how various design parameters may be determined to effect a change in NFET threshold voltages (Vt) 504.

Figure 6:
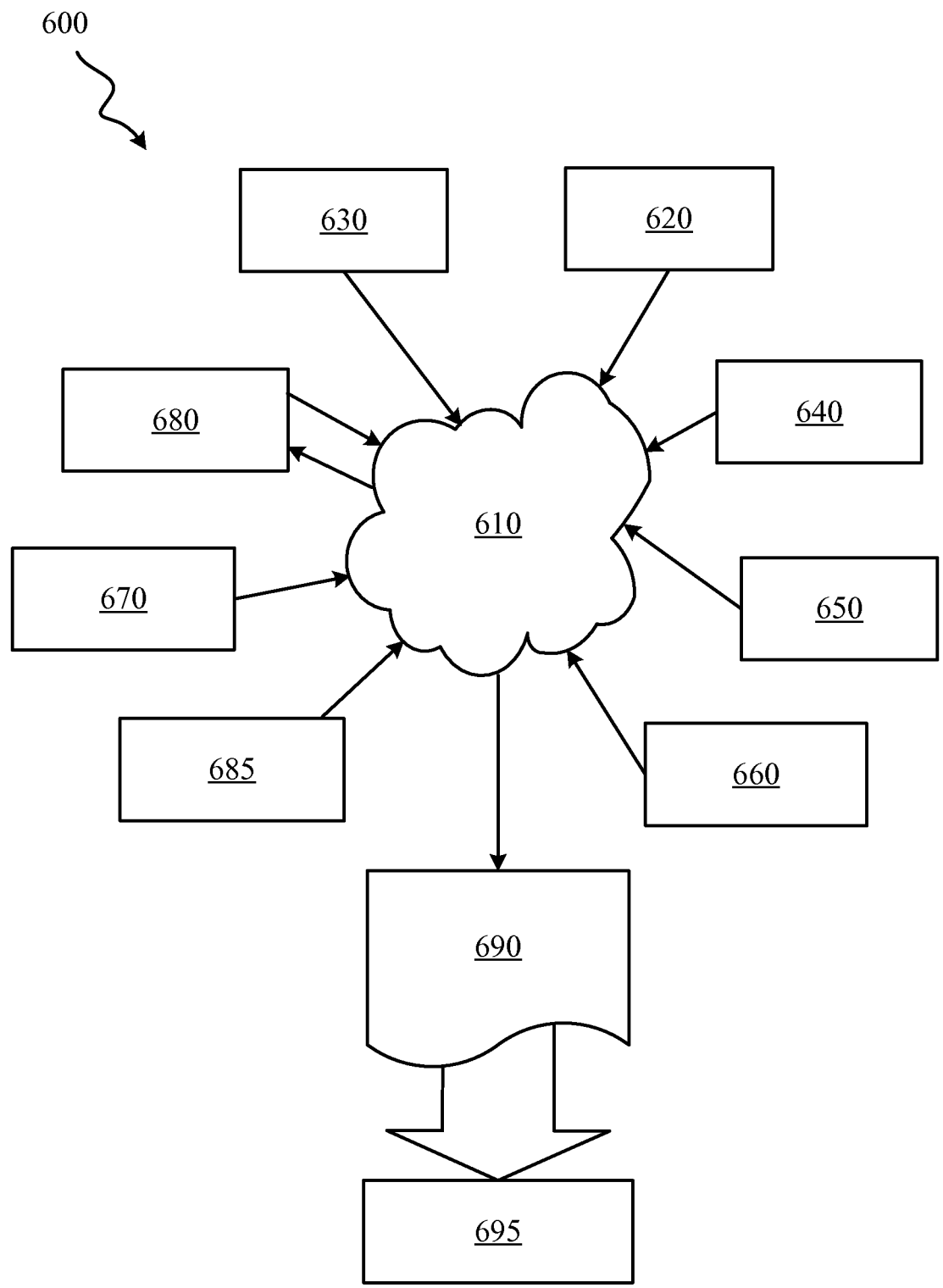
FIG. 6 is a flow diagram of a design process used in semiconductor design, manufacture, and/or test of the inventive SRAM depicted in FIG. 3, 4, according to embodiments of the invention.

FIG. 6 illustrates multiple design structures 600 including an input design structure 620 that is preferably processed by a design process. Design structure 620 may be a logical simulation design structure generated and processed by design process 610 to produce a logically equivalent functional representation of a hardware device. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable data transmission, gate array, or storage medium, design structure 620 may be accessed and processed by one or more hardware or software modules within design process 610 to simulate or otherwise functionally represent an electronic component, circuit, electronic or logic module, apparatus, device, or system such as those shown in FIGS. 3 and 4. As such, design structure 620 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures shown in FIGS. 3 and 4 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describe the connections to other elements and circuits in an integrated circuit design. Netlist 680 may be synthesized using an iterative process in which Netlist 680 is resynthesized one or more times depending on design specifications and parameters for the device. As with other design structure types described herein, Netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 650, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 3 and 4. In one embodiment, design structure 690 may comprise a compiled, executable HDL simulation model that functionally simulates the devices shown in FIGS. 3 and 4.

Design structure 690 may also employ a data format used for the exchange of layout data of integrated circuits and/or symbolic data format (e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3 and 4. Design structure 690 may then proceed to a state 695 where, for example, design structure 690 proceeds to tape-out, is released to manufacturing, is released to a mask house, is sent to another design house, is sent back to the customer, etc.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:

1. A static random access memory (SRAM) comprising:
 two or more SRAM memory cells connected with a write bit line (WBL) and a write bit line complement (WBLC);
 a write driver logic coupled to the WBL and the WBLC, the write driver logic adapted to drive a selected bit line of the WBL and the WBLC to a voltage uplevel below a first supply voltage and shut off the drive to the selected bit line when the selected bit line reaches the uplevel;

the write driver logic further adapted to drive an unselected bit line of the WBL and the WBLC to a downlevel, in conjunction with the driving of the selected bit line to the uplevel, wherein the downlevel is a voltage suitable to be interpreted as a downlevel on the WBLC by two or more SRAM cells.

2. The SRAM of claim 1, wherein the write driver logic includes a first PFET transistor with a source connected to the supply voltage, a drain connected to the WBL, and a gate coupled with a first feedback path to turn off the first PFET transistor when the WBL reaches the uplevel, and a second PFET transistor with a source connected to the supply voltage, a drain connected to the WBLC, and a gate coupled with a second feedback path to turn off the second PFET transistor when the WBLC reaches the uplevel.

3. The SRAM of claim 2, wherein the first and second feedback paths are timed to turn off the first and second PFETs, respectively, so that the WBL and WBLC reach the uplevel.

4. The SRAM of claim 2, wherein the write driver logic includes a first NFET transistor with a source connected to ground, a drain connected to the WBL, and a gate coupled with a complement of a data input, and a second NFET transistor with a source connected to ground, a drain connected to the WBLC, and a gate coupled with the data input.

5. The SRAM of claim 2, wherein a first keeper device is connected between the WBL and the first supply voltage and a second keeper device is connected between the WBLC and the first supply voltage, to maintain the selected bit line at the uplevel.

6. The SRAM of claim 5, wherein the first keeper device includes a first keeper feedback path to maintain the WBL at the uplevel voltage until the WBL is driven to the downlevel voltage, and a second keeper device which includes a second keeper feedback path to maintain the WBLC at the uplevel voltage until the WBLC is driven to the downlevel voltage.

7. The SRAM of claim 6, wherein the first keeper feedback path comprises an NFET with a source coupled to the WBL and a drain coupled the first supply voltage, and the second keeper feedback path comprises an NFET with a source coupled to the WBLC and a drain coupled the first supply voltage.

8. A static random access memory (SRAM) comprising:
two or more SRAM memory cells connected with a write bit line (WBL);
a write driver logic coupled to the WBL;
the write driver logic adapted to drive the WBL to a voltage uplevel below a first supply voltage in response to a first logical value on a data input;
the write driver logic further adapted to shut off the drive to the WBL when the WBL reaches the uplevel;
the write driver logic further adapted to drive the WBL to a downlevel, in response to a second logical value on the data input, wherein the downlevel is a voltage suitable to be interpreted as a downlevel on the WBLC by two or more SRAM cells.

9. The SRAM of claim 8, wherein the write driver logic includes a PFET transistor with a source connected to the first supply voltage, a drain connected to the WBL, and a gate coupled with a feedback path to turn off the PFET transistor when the WBL reaches the uplevel.

10. The SRAM of claim 9, wherein the feedback path is timed to turn off the PFET so that the WBL voltage reaches the uplevel.

11. The SRAM of claim 9, wherein the write driver logic includes an NFET transistor with a source connected to ground, a drain connected to the WBL, and a gate coupled with a data input.

12. The SRAM of claim 9, wherein a keeper device is connected between the WBL and the first supply voltage to maintain WBL at the uplevel.

13. The SRAM of claim 12, wherein the keeper device includes a keeper feedback path to maintain the WBL at the uplevel voltage until the WBL is driven to the downlevel voltage.

14. The SRAM of claim 13, wherein the keeper feedback path comprises an NFET with a source coupled to the WBL and a drain coupled the first supply voltage.

15. A design structure tangibly embodied in a machine-readable storage medium used in a design process of an SRAM, the design structure having elements that, when processed in a semiconductor manufacturing facility, produce an SRAM that comprises:
two or more SRAM memory cells connected with a write bit line (WBL) and a write bit line complement (WBLC);
a write driver logic coupled to the WBL and the WBLC, the write driver logic adapted to drive a selected bit line of the WBL and the WBLC to a voltage uplevel below a first supply voltage and shut off the drive to the selected bit line when the selected bit line reaches the uplevel;
the write driver logic further adapted to drive an unselected bit line of the WBL and the WBLC to a downlevel, in conjunction with the driving of the selected bit line to the uplevel, wherein the downlevel is a second supply voltage lower than the first supply voltage.

16. The design structure of claim 15, wherein the design structure comprises a Netlist which describes the SRAM.

17. The design structure of claim 15, wherein the design structure resides on a storage medium as a data format used for the exchange of layout data of integrated circuits.

18. The design structure of claim 15, wherein the design structure includes at least one set of test data files, characterization data, verification data, or design specifications.

19. The design structure of claim 15, wherein the write driver logic includes a first PFET transistor with a source connected to the first supply voltage, a drain connected to the WBL, and a gate coupled with a first feedback path to turn off the first PFET transistor when the WBL reaches the uplevel, and a second PFET transistor with a source connected to the supply voltage, a drain connected to the WBLC, and a gate coupled with a second feedback path to turn off the second PFET transistor when the WBLC reaches the uplevel.

20. The design structure of claim 19, wherein the first and second feedback paths are timed to turn off the first and second PFETs, respectively, so that the WBL and WBLC voltage levels reach the uplevel.

\* \* \* \* \*